United States Patent
Davies et al.

[11] 3,948,429
[45] Apr. 6, 1976

[54] APPARATUS FOR THERMOCOMPRESSION BONDING

[75] Inventors: Robert W. Davies, Whitehall; Thomas S. Ellington, IV, Bethlehem, both of Pa.

[73] Assignee: Western Electric Company, Inc., New York, N.Y.

[22] Filed: Nov. 1, 1974

[21] Appl. No.: 520,181

[52] U.S. Cl............ 228/44.1 A; 228/180 A; 228/242
[51] Int. Cl.².................................... B23K 19/00
[58] Field of Search............ 29/498; 228/44, 51, 54, 228/55, 44.1 A, 180 A, 242

[56] References Cited
UNITED STATES PATENTS

| | | | |
|---|---|---|---|
| 1,350,181 | 8/1920 | Remane | 228/54 X |
| 2,534,257 | 12/1950 | Flournoy | 228/55 |
| 2,935,592 | 5/1960 | Thuillier | 228/54 X |
| 3,099,084 | 7/1963 | Thuillier | 228/54 X |
| 3,442,432 | 5/1969 | Santangini | 228/44 |

OTHER PUBLICATIONS

Eleftherion "Assembling Beam–Lead Seal–Junction Integrated–Circuit Packages," *The Western Electric Engineer*, Dec. 1967, pp. 24–26.

*Primary Examiner*—Al Lawrence Smith
*Assistant Examiner*—K. J. Ramsey
*Attorney, Agent, or Firm*—R. Y. Peters

[57] ABSTRACT

Leads are bonded to thin-film conductors on a substrate by the application of heat and pressure of a thermode. The thermode encloses a fusible material, adjacent its tip, which is heated and fused during the nonbonding portion of a bonding cycle. During the bonding portion of the bonding cycle, the fused material supplies the heat of fusion to the thermode tip when the tip contacts the leads. This helps maintain control of the tip temperature.

11 Claims, 5 Drawing Figures

APPARATUS FOR THERMOCOMPRESSION BONDING

BACKGROUND OF THE INVENTION

1. Field of the Invention

The invention relates to methods and thermodes for thermocompression bonding and, more particularly, to methods using a thermode enclosing a fusible material adjacent the tip.

2. Description of the Prior Art

The fundamentals of thermocompression bonding are set forth on pages 604–612 of the book, R. W. Berry, P. M. Hall and M. T. Harris, *Thin Film Technology*, D. Van Nostrand, Princeton, N.J., Ch. 12 (1968). Briefly, thermocompression bonding is a solid-phase bonding technique which forms the bond between two members by inducing a suitable amount of material flow in one or both members. The material flow is induced by the application of heat and pressure, which are maintained for a suitable length of time so that adhesion takes place without the presence of a liquid phase. An anvil is used to support the members and a thermode is employed to press the mating surfaces together and deliver the necessary thermal energy for the time required to bond them. Typically, the temperature of the members initially rises very rapidly when the thermode contacts one of the members, and then rises gradually until contact is broken. If the gradient following the initial rise in temperature can be increased, the interface temperature between the mating surfaces will be increased and the time required to complete the bond can be shortened. This shortening, even in terms of a fraction of a second, is significant and important because of the very large number of bonds to be made. In terms of percentages, for example, one half of a second saved could mean a 25% to 50% reduction in bonding time.

The thermode must operate at about 800°C which is a dull red heat. At this temperature most metals oxidize very rapidly and, therefore, the thermode is made of an oxidation resistant alloy such as stainless steel or similar material. These metals are poor thermal conductors compared to steel and copper which have thermal coefficients of conductivity roughly about four times as great and 20 times as great, respectively. As a consequence, heat lost from the tip of a stainless steel thermode or the like is slow to be replaced and the longer the heat path the slower it becomes. This aggravates the initial temperature drop and subsequent gradient and makes them worse than they would otherwise be if a good conductivity metal could be used.

The problem is further aggravated by the need to make the tip narrow to meet mechanical requirements. This precludes the possibility of positioning the primary source of heat for the thermode in close proximity to the tip.

SUMMARY OF THE INVENTION

Accordingly, it is an object of the invention to provide new and improved methods and apparatus for thermocompression bonding. Another object is to provide a secondary source of heat in close proximity to the tip of the thermode.

With these and other objects in view, the present invention contemplates a new method for thermocompression bonding one article to another article, wherein a thermode having a fusible material enclosed adjacent the tip is heated and the article to be bonded is contacted with the tip of the thermode.

The present invention also contemplates an apparatus for thermocompression bonding one article to another wherein a bonding thermode includes a fusible material adjacent the tip to control the temperature of the tip.

The invention may also contemplate a thermode having iron-nickel-chromium or iron-nickel-molybdenum bodies which enclose a eutectic-composition alloy of copper and silver very close to the tip of the thermode. The alloy may have indium added to lower its melting point below that of the eutectic alloy alone.

The eutectic alloy is fusible and is melted by the thermode heat source, such as a cartridge type heater. The heat required to melt the alloy, the heat of fusion, is available to supply heat to the contact surface of the tip. When contact is made, heat stored in the molten alloy flows the short distance to the tip to maintain its temperature.

The invention further contemplates bonding lead frames to thin-film conductors on a substrate. During the contact portion of the cycle some, if not all, of the alloy freezes as the heat of fusion is released. This heat loss is replaced during the noncontact portion of the bonding cycle.

BRIEF DESCRIPTION OF THE DRAWINGS

Other objects, advantages and features of the invention will be apparent from the following detailed description thereof, when read in conjunction with the accompanying drawings, in which.

DETAILED DESCRIPTION

Figure 1:
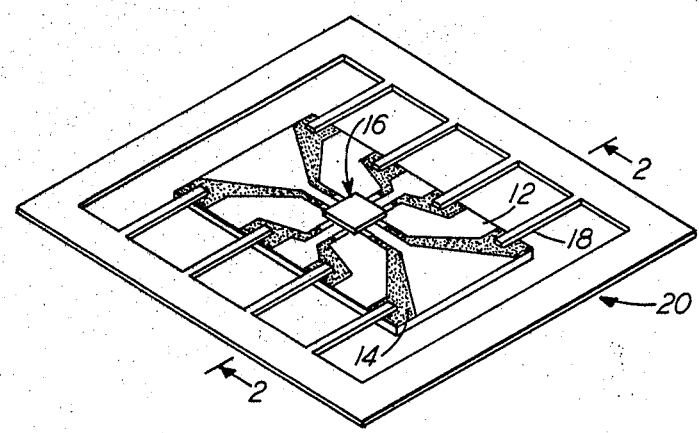
FIG. 1 is an isometric view of thin-film conductors and a lead frame in position for bonding to the frame.

Referring now to FIG. 1, there is shown a substrate 12 having a pattern of thin-film conductors 14. A beam-lead integrated circuit 16 and leads 18, of a lead frame 20, are bonded to the conductors 14.

The substrate 12 may be of any suitable material such as an aluminum oxide ceramic. The thin-film conductors 14 may be comprised of successive layers of titanium, palladium and gold formed in a desired pattern on the substrate 12 by methods well known in the art. Typically, the lead frame 20 is gold-plated copper and the leads 18 are approximately 0.005 inches thick by 0.015 inches wide.

Figure 2:
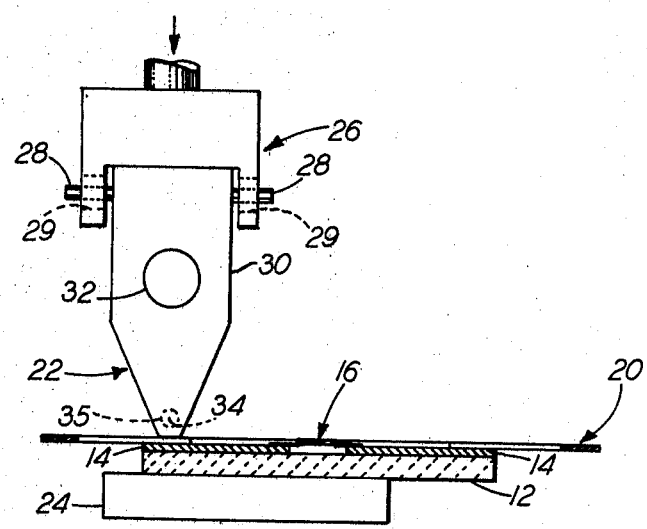
FIG. 2 is a cross-sectional view, along line 2—2 of FIG. 1, and additionally shows a thermode.

Bonding the leads 18 to the conductors 14 is accomplished by applying heat and pressure to the leads and conductors with a thermode 22, refer to FIG. 2, while the substrate 12 is supported by an anvil 24.

The thermode 22 is held in a yoke 26, which is retained in a ram of a suitable press or bonding apparatus (not shown), by pins 28 and cooperating slots 29. This method of retaining thermode 22 permits limited movement and alignment of the thermode with the frame 20, substrate 12 and anvil 24 to compensate for slight deviations.

Figure 3:
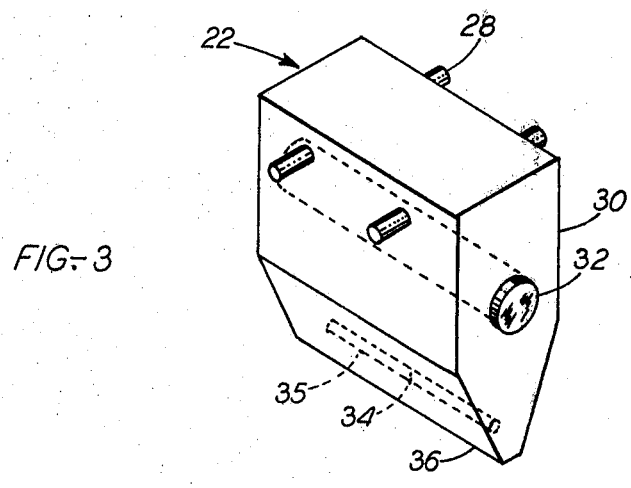
FIG. 3 is an isometric view showing a thermode which encloses a fusible material adjacent its tip.

The thermode 22, refer to FIG. 3, includes the pins 28 protruding from a body 30, a heater 32, and a fusible material 34 adjacent a tip 36. The body 30, which typically is about 1 inch wide, 1.5 inches high and 2 inches long, must operate at temperatures of about 800°C. Accordingly, the body 30 is made of materials which withstand oxidation and maintain their strength at elevated temperatures. Some such materials are: AISI 616 steel, AISI 660–665 austenitic alloys, and nickel, chromium, iron alloys having the approximate composition of 80% Ni, 13% Cr, and 7% Fe, or nickel, molybdenum, iron alloys having the approximate composition of 6–22% Fe, 22–32% Mo, and the balance Ni, sold under the trade designations "Inconel" and "Hastelloy," respectively.

The heater 32 may be of the cartridge type electrical resistance heater such as that sold by Watlow Electric Mfg. Co., St. Louis, Missouri under the trade designation "Model No. G3J22, " 500 watts. The size of a bore 31 in the body 30 is such that intimate contact is obtained between the heater 32 and the body, e.g., the diameter of the bore 31 is made an interference fit for the cartridge heater 32.

The fusible material 34 may be the eutectic composition of silver and copper, i.e., 72% silver and 28% copper by weight. This composition melts at 778°C and the melting temperature is lowered, preferably, by the addition of 2% by weight of indium to the eutectic composition. The material 34 is most conveniently obtained and used in the form of wire about 0.015 inches in diameter. A cavity 35 about 0.020 inches in diameter is machined, preferably by electrical discharge methods well known in the art, in the body 30 with its axis parallel to and about 0.020 inches away from the tip 36. A length of wire of the fusible material 34 a little shorter than the length of the body 30 is inserted in the cavity 35. The ends of the cavity 35 are then welded closed to form a thermode 22 with fusible material 34 enclosed adjacent its tip 36.

Figure 4:
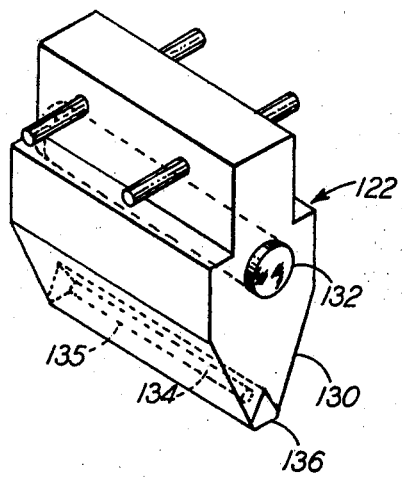
FIG. 4 is an isometric view of a thermode of alternate construction enclosing a fusible material adjacent its tip.

In an alternative construction, refer to FIG. 4, a body 130 of a thermode 122 is made of an oxidation resistant material such as nickel. A tip 136 of Inconel is welded to the nickel body 130 to provide tip strength at the high temperatures. A cavity 135 is machined in the tip portion, fusible material 134 inserted in the cavity and the cavity welded closed, as before.

Figure 5:
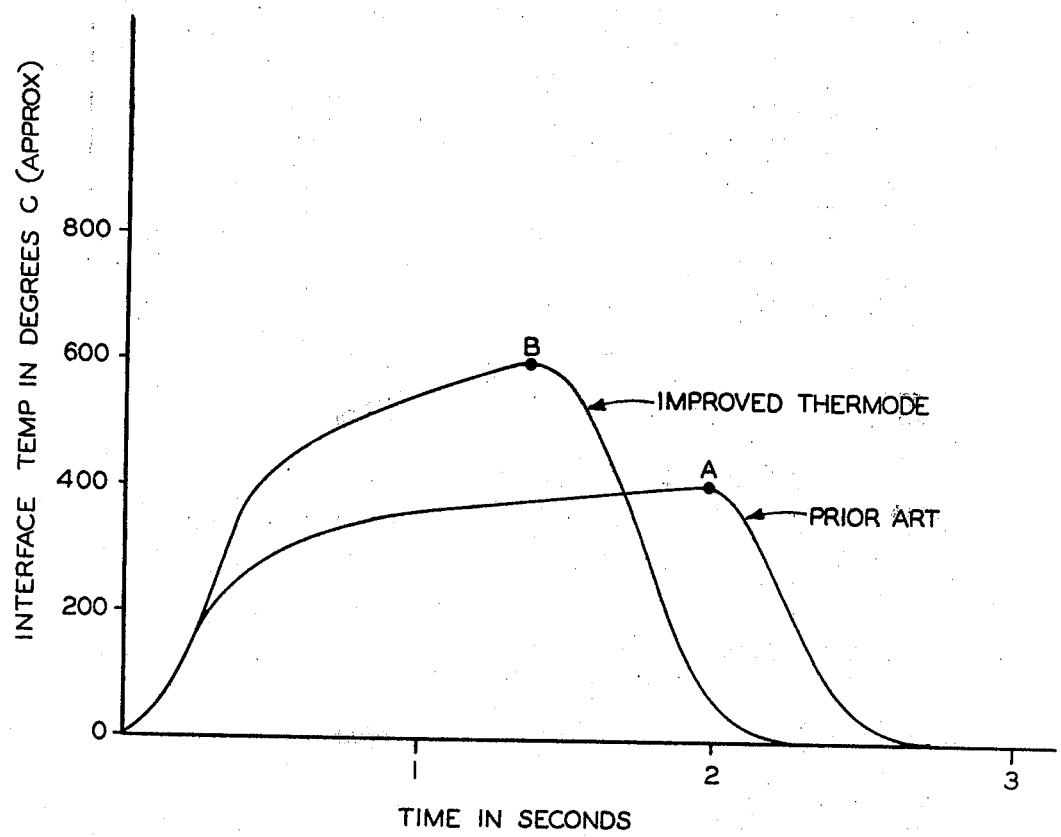
FIG. 5 is an illustration of the variation of temperature with time which indicates the affect of the fusible material.

In operation, refer to FIGS. 2 and 5, energy is applied to the heater 32 to heat the thermode 22 to about 800°C to liquefy the fusible material 34. Then the substrate 12 and lead frame 20 are placed on the anvil 24 and the leads 18 aligned with the conductors 14. Next, the thermode 22 is lowered so that the contacting surface of the tip 36 forces the leads 18 against the conductors 14 along one side of the substrate. This deforms the lead and conductor material and increases the interface temperature, sharply at first, at the bond site to a maximum as illustrated in FIG. 5. The temperature of the tip normally falls fairly rapidly because heat is conducted away from the contact surface of the tip 36 faster than it is replaced. Because of this drop, the thermode tip 36 must be maintained in contact with the leads 18 until the point A. This is a longer time than would be required without the temperature drop.

The heat is replaced at a faster rate by putting a heat sink or secondary source of heat, i.e., the fusible material 34, adjacent the tip 36 parallel to its contact surface. Heat is stored in the material 34 as the heat of fusion and all or a portion of it, is given up to the contact surface of the tip 36 when contact is made with the leads 18. Even though heat is still not replaced at the tip as fast as it is drawn away, the difference between withdrawal and replacement is much less. Accordingly, the temperature of the tip 36 decreases less, i.e., the tip temperature remains higher. When the temperature is higher, the tip 36 need only be maintained in contact with the leads 18 to the point B of the improved thermode curve of FIG. 5 and, therefore, the bonding time is shorter.

The primary heat source, heater 32, starts replacing the heat lost as soon as contact between the tip 36 and leads 18 is broken. The fusible material 34 which solidified in giving up its heat of fusion, remelts during the time required to prepare the substrate 12 and frame 20 for the next bond. It is ready, therefore, to give up its heat of fusion again on the next cycle.

While there has been described and illustrated herein practical embodiments of the present invention, it is understood that various modifications and refinements which depart from the disclosed embodiment may be adopted without departing from the spirit and the scope of the present invention. For example, a thermode having fusible material adjacent the contact surface of each of two tips 36 to contact leads 18 on both sides of the substrate 12 simultaneously, might be adopted.

We claim:

1. An apparatus for thermocompression bonding an article which comprises:
   a body of a first material resistant to oxidation;
   a tip, of a second material capable of resisting deformation at bonding temperatures, at one extremity of the body for contacting the article to be bonded, said tip having an elongated flat contacting surface;
   a third material incorporated in the tip; and
   means for heating the body and for melting the third material when the tip is not in contact with the article to be bonded, said third material solidifying and releasing its heat of fusion to the contacting surface to aid in maintaining the temperature of the surface when said surface is in contact with the article to be bonded, said third material being incorporated in the tip parallel to and adjacent the contacting surface.

2. An apparatus as recited in claim 1, wherein the third material is selected from the group comprising copper, silver and indium.

3. An apparatus as recited in claim 2, wherein the second material is selected from the group consisting of nickel-chromium-iron or nickel-molybdenum-iron alloys.

4. An apparatus as recited in claim 9, wherein the second material comprises 7% Fe, 80% Ni, and 13% Cr and the third material comprises the eutectic composition of copper and silver to which is added 2% indium.

5. An apparatus for thermocompressively bonding one article to another article comprising:
   a body of a first material resistant to oxidation and to deformation at bonding temperature;
   at least one tip at one extremity of the body, said tip having an elongated flat surface for contacting one of the articles to be bonded;
   a second material incorporated in such tip parallel and adjacent said surface; and
   means for heating the body and for melting the second material when the surface is not in contact with one of the articles, said second material solidifying when said surface is in contact with an article to release its heat of fusion to the surface to aid in maintaining the temperature of said surface.

6. An apparatus as recited in claim 5, wherein the articles to be bonded comprise a lead and a thin-film conductor.

7. An apparatus as recited in claim 6, wherein the second material comprises 72% silver and 28% copper by weight.

8. An apparatus as recited in claim 7, wherein the second material comprises the eutectic proportions of silver and copper with 2% indium by weight added.

9. An apparatus as recited in claim 8, and wherein thin-film conductors lie along two sides of a substrate and leads are to be bonded to both sides simultaneously, which comprises two tips, each having the second material incorporated adjacent and parallel the surface for contacting the leads, said tips being parallel and spaced from each other in the same plane to contact the leads along both sides of the substrate simultaneously.

10. An apparatus as recited in claim 7, wherein the body comprises an alloy selected from the group comprising nickel-chromium-iron or nickel-molybdenum-iron alloys.

11. An apparatus as recited in claim 7, wherein the means for heating comprises an electrical resistance heater.

* * * * *